US008575630B2

(12) United States Patent
Ito et al.

(10) Patent No.: US 8,575,630 B2
(45) Date of Patent: Nov. 5, 2013

(54) LIGHT EMITTING DEVICE, LIGHT EMITTING DEVICE UNIT, AND METHOD FOR FABRICATING LIGHT EMITTING DEVICE

(75) Inventors: Masayuki Ito, Osaka (JP); Masataka Miyata, Osaka (JP); Taro Yamamuro, Osaka (JP); Syoji Yokota, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 95 days.

(21) Appl. No.: 13/254,070

(22) PCT Filed: Feb. 26, 2010

(86) PCT No.: PCT/JP2010/053046
§ 371 (c)(1),
(2), (4) Date: Aug. 31, 2011

(87) PCT Pub. No.: WO2010/101079
PCT Pub. Date: Sep. 10, 2010

(65) Prior Publication Data
US 2011/0316011 A1 Dec. 29, 2011

(30) Foreign Application Priority Data

Mar. 3, 2009 (JP) ................................. 2009-049634

(51) Int. Cl.
*H01L 33/08* (2010.01)
(52) U.S. Cl.
USPC .................. 257/88; 257/93; 257/89; 257/90; 257/91; 257/92; 257/E33.012
(58) Field of Classification Search
USPC ....................................... 257/88–92, E33.012
See application file for complete search history.

(56) References Cited

U.S. PATENT DOCUMENTS

| 6,033,087 | A  | * | 3/2000 | Shozo et al. | 362/244 |
|---|---|---|---|---|---|
| 7,417,259 | B2 | * | 8/2008 | Sakai et al. | 257/88 |
| 8,076,680 | B2 |   | 12/2011 | Lee et al. |   |
| 8,405,318 | B2 |   | 3/2013 | Hatakenaka et al. |   |
| 2008/0149951 | A1 | * | 6/2008 | Lin et al. | 257/91 |
| 2009/0267085 | A1 |   | 10/2009 | Lee et al. |   |
| 2010/0039044 | A1 |   | 2/2010 | Hatakenaka et al. |   |

FOREIGN PATENT DOCUMENTS

| CN | 101142692 A | 3/2008 |
|---|---|---|
| JP | 54-54360 | 9/1952 |
| JP | 63-046781 | 2/1988 |
| JP | 63-145352 | 9/1988 |

(Continued)

OTHER PUBLICATIONS

International Search Report for PCT/JP2010/053046, mailed Mar. 30, 2010.

*Primary Examiner* — Minchul Yang
(74) *Attorney, Agent, or Firm* — Nixon & Vanderhye, P.C.

(57) ABSTRACT

In a light emitting device, a light emitting device unit, and a method for fabricating a light emitting device according to an embodiment of the present invention, a light emitting device (100) includes a substrate (131), a semiconductor light emitting element (121) disposed on the substrate (131), and a resistor (122) coupled to the semiconductor light emitting element (121). The resistor (122) is coupled in parallel to the semiconductor light emitting element (121). The resistor (122) has a resistance set at such a value that when a light emitting operation voltage for causing light emission of the semiconductor light emitting element (121) is applied to the semiconductor light emitting element (121), a current flowing through the resistor (122) is equal to or less than one-fiftieth of a current flowing through the semiconductor light emitting element (121).

11 Claims, 9 Drawing Sheets

(56) References Cited

FOREIGN PATENT DOCUMENTS

| | | |
|---|---|---|
| JP | 63-180957 | 11/1988 |
| JP | 6-318732 | 11/1994 |
| JP | 11-298041 | 10/1999 |
| JP | 11-307815 | 11/1999 |
| JP | 2004-029370 | 1/2004 |
| JP | 2004-193530 | 7/2004 |
| JP | 2004-340830 | 12/2004 |
| JP | 2007-294547 | 11/2007 |
| WO | WO 2008/105245 A1 | 9/2008 |

* cited by examiner (A)

(B)

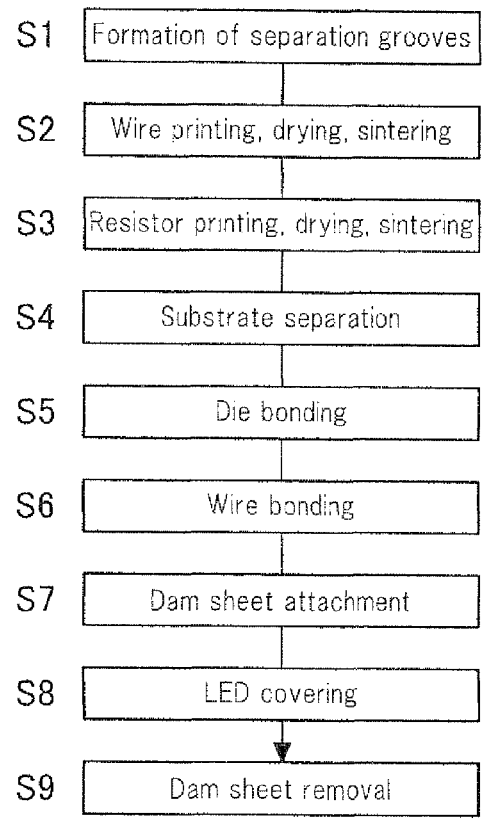
FIG.6A
- S1 Formation of separation grooves
- S2 Wire printing, drying, sintering
- S3 Resistor printing, drying, sintering
- S4 Substrate separation
- S5 Die bonding
- S6 Wire bonding
- S7 Dam sheet attachment
- S8 LED covering
- S9 Dam sheet removal
FIG.6B
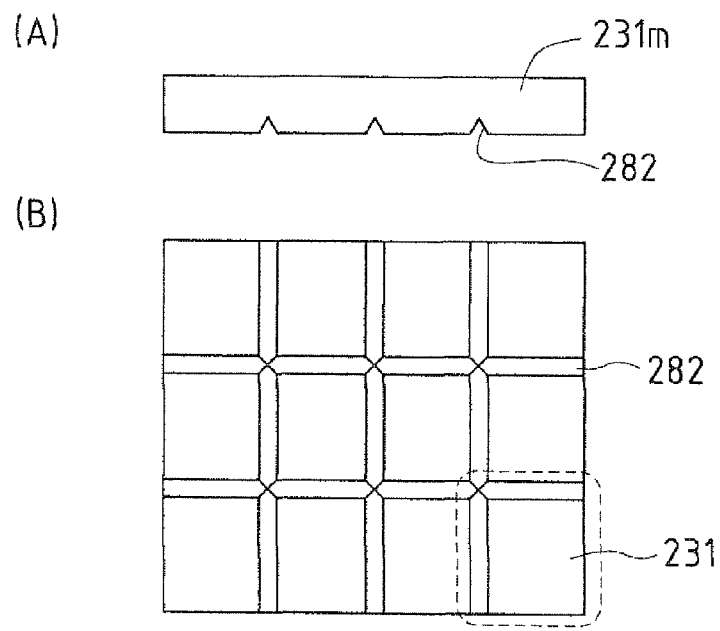

(A)

(B)

LIGHT EMITTING DEVICE, LIGHT EMITTING DEVICE UNIT, AND METHOD FOR FABRICATING LIGHT EMITTING DEVICE

This application is the U.S. national phase of International Application No. PCT/JP2010/053046 filed 26 Feb. 2010 which designated the U.S. and claims priority to JP Patent Application No. 2009-049634 filed 3 Mar. 2009, the entire contents of each of which are hereby incorporated by reference.

TECHNICAL FIELD

The present invention relates to a light emitting device that includes a light emitting device unit including a semiconductor light emitting element (LED) disposed on a substrate and a resistor coupled to the LED, relates to a light emitting device unit constituting the light emitting device, and relates to a method for fabricating the light emitting device.

BACKGROUND ART

LEDs (Light Emitting Diodes), with their recent improvements in efficiency, have come into widespread use in backlights of display devices and in lighting equipment, as energy saving light sources over light bulbs and fluorescent lights. In such applications, energy efficiency is very important.

LEDs, especially gallium nitride LEDs, are subject to failure due to electrostatic discharge, that is, has a property of low reverse breakdown voltage. As a countermeasure, a technique of disposing a zener diode in inverse parallel with an LED is disclosed (see, for example, Patent Citation PTL 1).

In this case, the LED is protected from an overvoltage because with a forward overvoltage, an overcurrent is bypassed by a zener-breakdown, while with a reverse overvoltage, an overcurrent is bypassed as a regular forward. The LED has a forward voltage lower than a zener breakdown voltage of the zener diode. Thus, when the forward voltage is applied to the LED, no current flows through the zener diode, resulting in no energy loss. Compared with resistors, however, zener diodes cannot be fabricated easily and involve more laborious work in, for example, mounting onto the LEDs. Moreover, zener diodes are less reliable than resistors in the long run.

Furthermore, a technique of coupling resistors to respective LEDs in parallel is disclosed (see, for example, PTL 2 or PTL 3).

In a technique disclosed in PTL 2, resistors are coupled in parallel to respective LEDs that are coupled to each other in series. Each resistor serves as a bypass resistor to ensure that breakage of one of the LEDs does not turn the other LEDs unlit. For the bypass resistors to serve their purpose, a current large enough to light the unbroken other LEDs needs to flow through the bypass resistors. Thus, the resistances of the resistors to be used need to be low. This poses a problem of large energy loss in the current flowing through the bypass resistors.

In the technique disclosed in PTL 3, in an assemblage LED device in which a plurality of LED chips are disposed in a single package, variable resistors are disposed in parallel to respective LED chips so as to adjust the luminance of the respective LED chips. In this case, the resistance of each resistor needs to be low enough to allow a current to flow therethrough in an amount that affects the luminance of the LED chip. That is, a problem of large energy loss arises.

Furthermore, a technique of disposing a thick film resistor in a LED package is disclosed as an example of forming a resistor to be coupled to an LED (see, for example, PTL 4).

CITATION LIST

Patent Literature

PTL 1: JP11-298041A
PTL 2: JP11-307815A
PTL 3: JP2007-294547A
PTL 4: JP63-180957U

SUMMARY OF INVENTION

Technical Problem

The present invention has been made in view of the above-described circumstances. It is an object of the present invention to provide a light emitting device that ensures reliability and minimizes energy loss. Specifically, a resistor is coupled in parallel to a semiconductor light emitting element. The resistor has a resistance set at such a value that when a light emitting operation voltage is applied to the semiconductor light emitting element, a current flowing through the resistor is equal to or less than one-fiftieth of a current flowing through the semiconductor light emitting element.

It is another object of the present invention to provide a light emitting device unit that ensures reliability and minimizes energy loss. Specifically, a resistor is coupled in parallel to a semiconductor light emitting element. The resistor has a resistance set at such a value that when a light emitting operation voltage is applied to the semiconductor light emitting element, a current flowing through the resistor is equal to or less than one-fiftieth of a current flowing through the semiconductor light emitting element.

It is still another object of the present invention to provide a method for fabricating a light emitting device that includes a light emitting device unit including a semiconductor light emitting element disposed on a substrate and a resistor coupled to the semiconductor light emitting element. The method includes a wiring electrode forming step, a resistor forming step, and a light emitting device unit forming step. This ensures highly productive manufacture of large light emitting devices.

Solution to Problem

According to one aspect of the present invention, a light emitting device includes at least one light emitting device unit. The at least one light emitting device unit includes a substrate, at least one semiconductor light emitting element, and a resistor. The at least one semiconductor light emitting element is disposed on the substrate. The resistor is coupled to the at least one semiconductor light emitting element. The resistor is coupled in parallel to the at least one semiconductor light emitting element. The resistor has a resistance set at such a value that when a light emitting operation voltage for causing light emission of the at least one semiconductor light emitting element is applied to the at least one semiconductor light emitting element, a current flowing through the resistor is equal to or less than one-fiftieth of a current flowing through the at least one semiconductor light emitting element.

This configuration minimizes a counter-electromotive force that ambient light causes to the semiconductor light emitting element when the semiconductor light emitting element is in light-off state, thereby minimizing degradation of the semiconductor light emitting element. The configuration also minimizes an increase in power consumption associated with the current that the light emitting operation voltage causes to flow through the resistor when the semiconductor light emitting element is in light-on state. This results in a light emitting device with an elongated service life to improve reliability and with minimized energy loss.

In the light emitting device according to the one aspect of the present invention, the at least one semiconductor light emitting element may include a gallium nitride semiconductor light emitting element. The resistance of the resistor may be equal to or more than 15 kΩ and equal to or less than 10 MΩ.

This configuration minimizes an increase in power consumption associated with the resistor coupled in parallel to the gallium nitride semiconductor light emitting element when the gallium nitride semiconductor light emitting element is in light-on state. The configuration also minimizes a counter-electromotive force applied to the gallium nitride semiconductor light emitting element due to ambient light when the gallium nitride semiconductor light emitting element is in light-off state.

In the light emitting device according to the one aspect of the present invention, the resistance of the resistor may be equal to or more than 150 kΩ and equal to or less than 1 MΩ.

This configuration more reliably minimizes power consumption when the gallium nitride semiconductor light emitting element is in light-on state, and more reliably minimizes a counter-electromotive force when the gallium nitride semiconductor light emitting element is in light-off state.

In the light emitting device according to the one aspect of the present invention, the resistor may include a thick film resistor disposed on the substrate.

This configuration ensures highly productive formation of the resistor on the substrate, which simplifies the assembly process and thus facilitates manufacture of large light emitting devices.

The light emitting device according to the one aspect of the present invention may further include a plurality of wiring electrodes to which the at least one semiconductor light emitting element and the thick film resistor are coupled. The plurality of wiring electrodes may be disposed in parallel to the at least one semiconductor light emitting element such that the at least one semiconductor light emitting element is disposed between the plurality of wiring electrodes. The thick film electrode may cross the plurality of wiring electrodes, so as to be coupled to the plurality of wiring electrodes.

This configuration ensures a light emitting device in which the semiconductor light emitting element, the wiring electrodes, and the resistor are accurately arranged so as to emit uniform light over a large area.

In the light emitting device according to the one aspect of the present invention, the substrate may include a recognition pattern serving as a marker in a fabrication process. The recognition pattern may include a same material as a material of the plurality of wiring electrodes or the thick film resistor.

This configuration facilitates formation of a recognition pattern, which is used in mounting of the semiconductor light emitting element, at the same time of formation of the wiring electrodes or the thick film resistor. This results in a highly productive light emitting device.

In the light emitting device according to the one aspect of the present invention, the resistor may include a chip resistor mounted on the substrate.

This configuration ensures highly productive mounting of the resistor on the substrate, which simplifies the assembly process and facilitates fabrication of a diminishable light emitting device unit.

In the light emitting device according to the one aspect of the present invention, the at least one semiconductor light emitting element of the at least one light emitting device unit may include a plurality of semiconductor light emitting elements coupled in parallel to each other.

This configuration enlarges the area of light emission and ensures a large light emitting device with a large light emitting device unit.

In the light emitting device according to the one aspect of the present invention, the at least one light emitting device unit may be sealed in a single package.

This configuration facilitates handling of the light emitting device, which improves its reliability and exchangeability.

In the light emitting device according to the one aspect of the present invention, the at least one light emitting device unit may include three or more light emitting device units coupled to each other in series. The three or more light emitting device units may constitute a first composite light emitting device unit.

With this configuration, the light emitting device includes a first composite light emitting device unit including three or more, individually packaged light emitting device units that are coupled to each other in the form of a string. This ensures a desired length for the light emitting device.

In the light emitting device according to the one aspect of the present invention, the at least one semiconductor light emitting element of the at least one light emitting device unit may include three or more semiconductor light emitting elements coupled to each other in series on the substrate. The three or more semiconductor light emitting elements may constitute a second composite light emitting device unit.

With this configuration, the light emitting device includes a second composite light emitting device unit including three or more light emitting device units coupled to each other in series on the same substrate. This ensures a light emitting device with high packaging density (light emission density).

In the light emitting device according to the one aspect of the present invention, the second composite light emitting device unit may be sealed in a single package.

This configuration facilitates handling of the light emitting device, which improves its reliability and exchangeability.

The light emitting device according to the present invention may further include a power source configured to supply a direct current to the at least one light emitting device unit.

This configuration ensures stable operation of a light emitting device of high reliability and low energy loss.

According to another aspect of the present invention, a light emitting device unit includes a substrate, at least one semiconductor light emitting element, and a resistor. The at least one semiconductor light emitting element is disposed on the substrate. The resistor is coupled to the at least one semiconductor light emitting element. The resistor is coupled in parallel to the at least one semiconductor light emitting element. The resistor has a resistance set at such a value that when a light emitting operation voltage for causing light emission of the at least one semiconductor light emitting element is applied to the at least one semiconductor light emitting element, a current flowing through the resistor is equal to or less than one-fiftieth of a current flowing through the at least one semiconductor light emitting element.

This configuration minimizes a counter-electromotive force that ambient light causes to the semiconductor light emitting element when the semiconductor light emitting element is in light-off state, thereby minimizing degradation of the semiconductor light emitting element. The configuration also minimizes an increase in power consumption associated with the current that the light emitting operation voltage causes to flow through the resistor when the semiconductor light emitting element is in light-on state. This results in a light emitting device unit with an elongated service life to improve reliability and with minimized energy loss.

According to still another aspect of the present invention, a method is for fabricating a light emitting device. The light emitting device includes at least one light emitting device unit. The at least one light emitting device unit includes a substrate, at least one semiconductor light emitting element, and a resistor. The at least one semiconductor light emitting element is disposed on the substrate. The resistor is coupled to the at least one semiconductor light emitting element. The method includes forming, by printing onto the substrate, a pair of wiring electrodes to which the at least one semiconductor light emitting element and the resistor are to be coupled. The resistor is formed onto the substrate by printing so that the pair of wiring electrodes are coupled to each other. The at least one semiconductor light emitting element is arranged between the pair of wiring electrodes. An electrode of the at least one semiconductor light emitting element is coupled to the pair of wiring electrodes so as to form the at least one light emitting device unit.

With this configuration, the wiring electrodes and the resistor are formed utilizing a printing technique. This ensures fabrication of a large light emitting device with high productivity.

In the method for fabricating a light emitting device according to the still another aspect of the present invention, the at least one light emitting device unit includes a plurality of light emitting device units disposed in parallel to each other and coupled to each other in series. The pair of wiring electrodes are disposed in parallel to one another so as to correspond to edge portions of each of the plurality of light emitting device units. One of the pair of wiring electrodes is commonly used by adjacent light emitting device units among the plurality of light emitting device units. The resistor is extended in a direction to cross the pair of wiring electrodes.

This configuration ensures a highly dense arrangement of the light emitting device units and the wiring electrodes, and facilitates fabrication of a light emitting device having a large area.

Advantageous Effects of Invention

According to one aspect of the present invention, a light emitting device includes at least one light emitting device unit. The at least one light emitting device unit includes a substrate, at least one semiconductor light emitting element, and a resistor. The at least one semiconductor light emitting element is disposed on the substrate. The resistor is coupled to the at least one semiconductor light emitting element. The resistor is coupled in parallel to the at least one semiconductor light emitting element. The resistor has a resistance set at such a value that when a light emitting operation voltage for causing light emission of the at least one semiconductor light emitting element is applied to the at least one semiconductor light emitting element, a current flowing through the resistor is equal to or less than one-fiftieth of a current flowing through the at least one semiconductor light emitting element. This minimizes a counter-electromotive force that ambient light causes to the semiconductor light emitting element when the semiconductor light emitting element is in light-off state, thereby minimizing degradation of the semiconductor light emitting element. This also minimizes an increase in power consumption associated with the current that the light emitting operation voltage causes to flow through the resistor when the semiconductor light emitting element is in light-on state. This results in advantageous effects such as an elongated service life to improve reliability and minimized energy loss.

According to another aspect of the present invention, a light emitting device unit includes a substrate, at least one semiconductor light emitting element, and a resistor. The at least one semiconductor light emitting element is disposed on the substrate. The resistor is coupled to the at least one semiconductor light emitting element. The resistor is coupled in parallel to the at least one semiconductor light emitting element. The resistor has a resistance set at such a value that when a light emitting operation voltage for causing light emission of the at least one semiconductor light emitting element is applied to the at least one semiconductor light emitting element, a current flowing through the resistor is equal to or less than one-fiftieth of a current flowing through the at least one semiconductor light emitting element. This minimizes a counter-electromotive force that ambient light causes to the semiconductor light emitting element when the semiconductor light emitting element is in light-off state, thereby minimizing degradation of the semiconductor light emitting element. This also minimizes an increase in power consumption associated with the current that the light emitting operation voltage causes to flow through the resistor when the semiconductor light emitting element is in light-on state. This results in advantageous effects such as an elongated service life to improve reliability and minimized energy loss.

According to still another aspect of the present invention, a method is for fabricating a light emitting device. The light emitting device includes at least one light emitting device unit. The at least one light emitting device unit includes a substrate, at least one semiconductor light emitting element, and a resistor. The at least one semiconductor light emitting element is disposed on the substrate. The resistor is coupled to the at least one semiconductor light emitting element. The method includes forming, by printing onto the substrate, a pair of wiring electrodes to which the at least one semiconductor light emitting element and the resistor are to be coupled. The resistor is formed onto the substrate by printing so that the pair of wiring electrodes are coupled to each other. The at least one semiconductor light emitting element is arranged between the pair of wiring electrodes. An electrode of the at least one semiconductor light emitting element is coupled to the pair of wiring electrodes so as to form the at least one light emitting device unit. The wiring electrodes and the resistor are formed utilizing a printing technique. This ensures fabrication of a large light emitting device with high productivity.

BRIEF DESCRIPTION OF DRAWINGS

FIG. 3 is a see-through side view of the light emitting device unit shown in FIG. 2, with a center portion of the light emitting device unit made seen through.

FIG. 6A is a flowchart schematically showing a method for fabricating a light emitting device, according to embodiment 3 of the present invention.

FIG. 6B is a diagram illustrating a condition of a substrate in the separating groove forming step shown in FIG. 6A, with (A) showing a side view of the substrate and (B) showing a plan view to illustrate a groove-formed surface of the substrate.

DESCRIPTION OF EMBODIMENTS

Embodiments of the present invention will be described below by referring to the accompanying drawings.

Comparative Example

Figure 7:
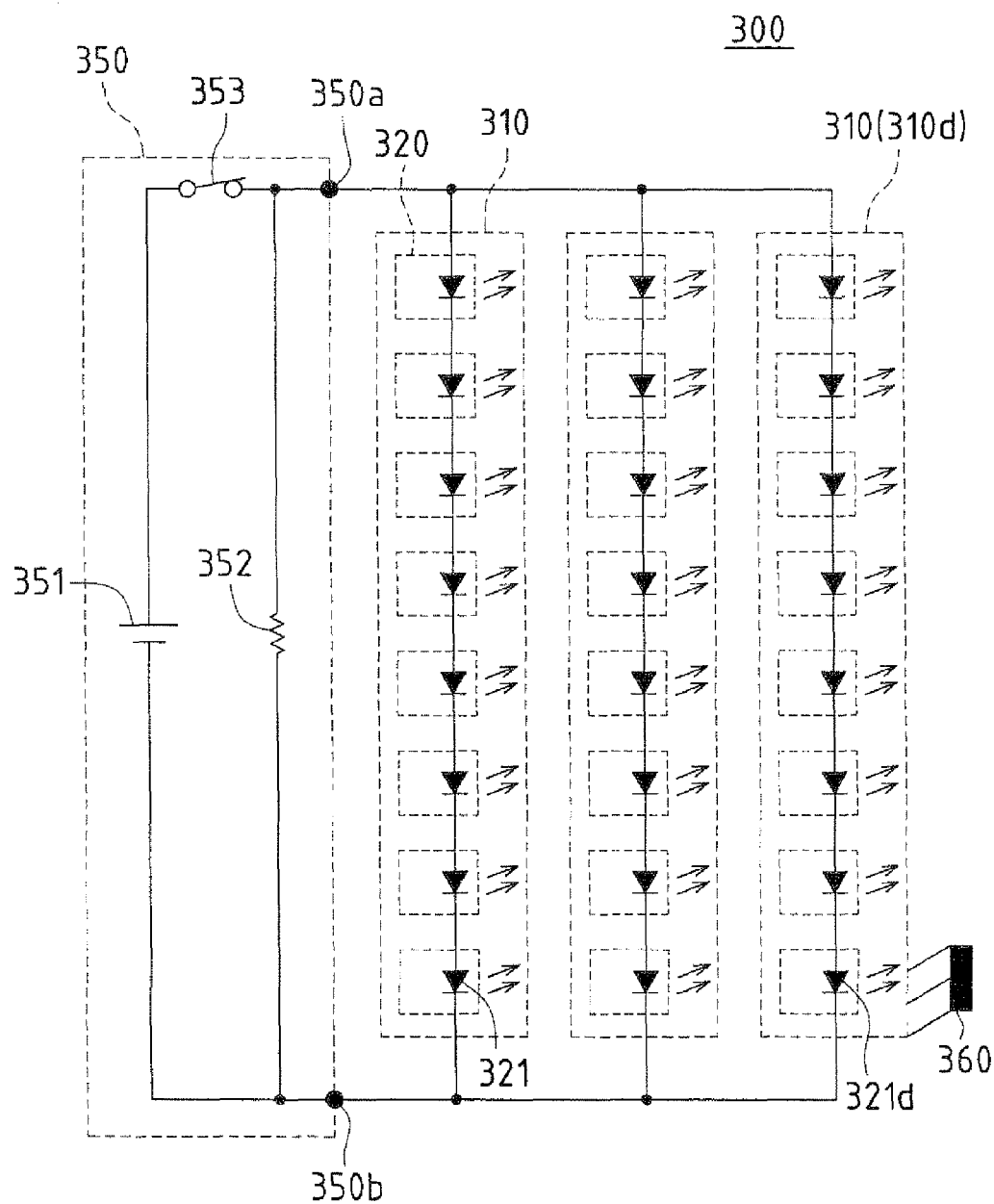
FIG. 7 is a circuit diagram of a light emitting device according to a comparative example.

A light emitting device as a comparative example will be first described to facilitate the understanding of the operations of the light emitting devices according to embodiments 1 to 3. FIG. 7 is a circuit diagram of a light emitting device according to a comparative example.

A light emitting device 300 according to the comparative example includes three composite light emitting device units 310 coupled in parallel to each other. Each of the composite light emitting device units 310 includes a plurality of (eight) light emitting device units 320 coupled to each other in series. Each of the light emitting device units 320 includes no resistor and includes only a semiconductor light emitting element 321 (LED 321).

The comparative example is in such a state, for example, that a light shield 360 shields only an LED 321d from light, among the light emitting device units 320 constituting a composite light emitting device unit 310d among the three composite light emitting diode units 310.

Light emitting devices are generally disposed outdoors and indoors to provide lighting with the LEDs on during the evening. This involves situations where the light emitting devices are exposed to ambient light such as sunlight during daytime, including some cases where ambient light is radiated partially, i.e., to only some of the LEDs (e.g., to LEDs 321 other than the LED 321d).

The light emitting device 300 was installed outdoors and kept in operation for some thousands of hours. As a result, a phenomenon occurred where the LED 321d, which was shielded from light, became unlit. An evaluation was carried out on the characteristics of the LEDs 321, which indicated that the LEDs 321 are degraded through continuous application of a reverse bias of approximately 10 V, and eventually become unlit.

In normal state, the composite light emitting device units 310 are constantly coupled to a power source 350. The operation mode of the power source 350 is either light-on mode in which a switch 353 is closed to apply forward voltage to the three composite light emitting device units 310 to light them or light-off mode in which the switch 353 is open so that the composite light emitting device units 310 (LEDs 321) are unlit. Thus, no consideration has been conventionally paid to an operation mode where a reverse bias is applied to the LED 321d.

The inventors used the new findings associated with the above-described phenomenon as a basis for a study to find out what causes the unlighting of the LED 321d. As a result, the inventors have found that in light-off mode, the light emitting device 300 forms a closed circuit through an output terminals-coupling parallel impedance 352, which exists between the output terminal 350a and the output terminal 350b; this can cause a reverse bias applied to some LED (e.g., the LED 321d) under a certain condition.

For example, it is assumed that the single LED 321d, among the eight LEDs 321 constituting a composite light emitting device unit 310, is shielded from light, while the remaining seven LEDs 321 are exposed to ambient light. A possible state here is that the seven LEDs 321 exposed to ambient light generate a photovoltage to apply a reverse bias to the light-shielded LED 321d.

The inventors calculated the value of the reverse bias as follows. Specifically, the value of the reverse bias applied to the LED 321d was calculated under an assumption that in the light emitting device 300, the output terminals-coupling parallel impedance 352 had the value Zps=14 k$\Omega$ and the intensity of ambient light was 100,000 lx (lux), which corresponds to outdoor illuminance.

It has been found that the seven LEDs 321 exposed to ambient light each generates a photovoltage of approximately 1 to 2 V, and that since the LEDs 321 are coupled to each other in series, a reverse bias of approximately 10 V is applied to the light-shielded LED 321d. Possible examples of ambient light include outdoor sunlight and light emitted from adjacent LEDs 321.

In the light emitting device 300 of the comparative example, the switch 353 is coupled on the side of the power source 351 relative to the output terminals-coupling parallel impedance 352.

A possible configuration of the comparative example is that the switch 353 is coupled on the side of the composite light emitting device unit 310 relative to the output terminals-coupling parallel impedance 352. That is, when the switch 353 is in open state, the output terminals-coupling parallel impedance 352 and the composite light emitting device unit 310 are not coupled to one another.

Also in this case, a possible state is that a closed circuit is formed by the other composite light emitting devices 310 coupled in parallel to each other so that a reverse bias is applied to the light-shielded LED 321d.

As described above, in the light emitting device 300 in the comparative example, when a light-shielded LED (e.g., the LED 321d) exists, the LED 321d can be degraded, causing problems including degraded reliability and a shortened service life of the light emitting device 300 (composite light emitting device units 310 and LEDs 321).

Embodiment 1

A light emitting device and light emitting device units according to this embodiment will be described by referring to FIG. 1 through FIG. 3.

Figure 1:
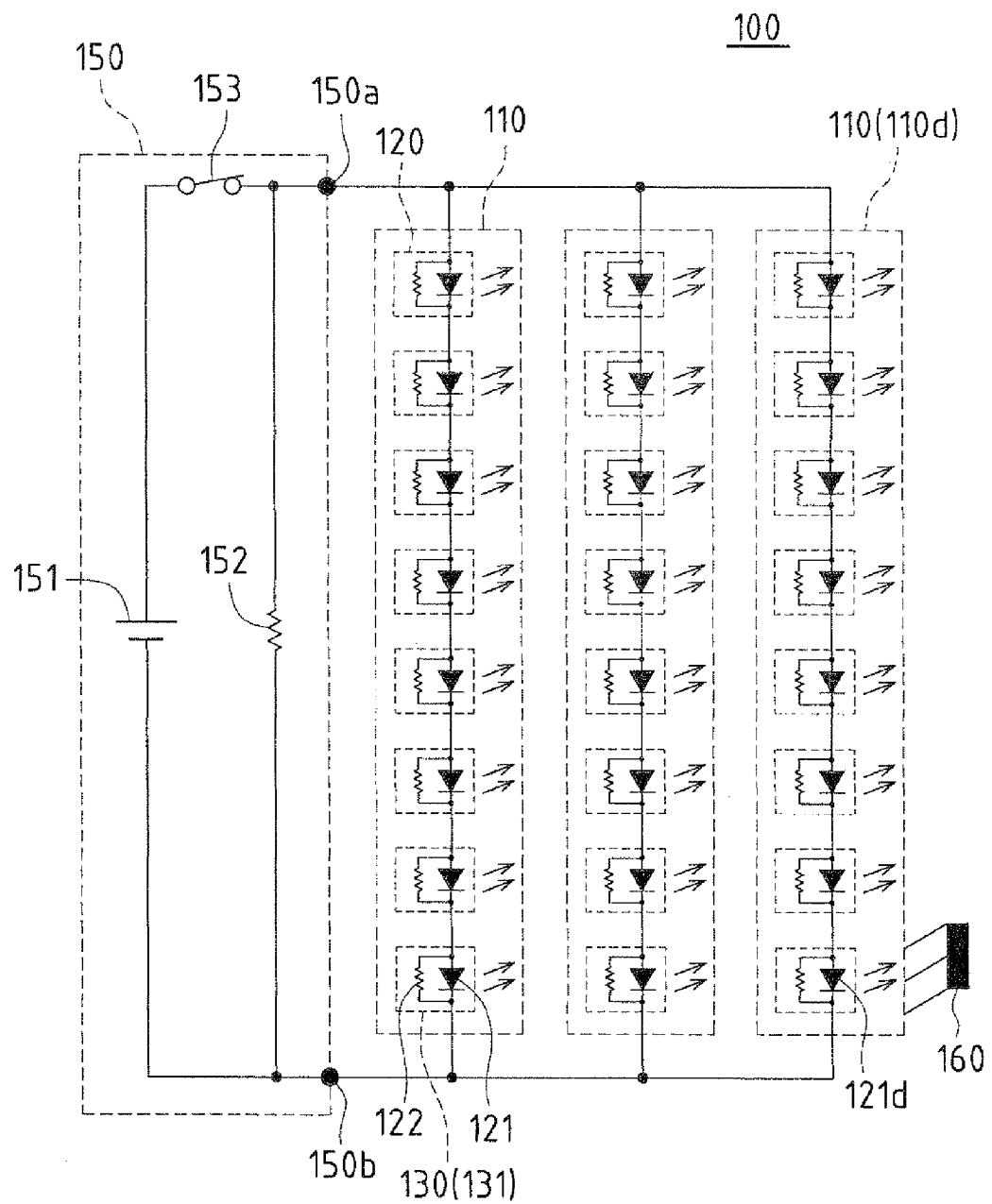
FIG. 1 is a circuit diagram of a light emitting device and light emitting device units according to embodiment 1 of the present invention.

FIG. 1 is a circuit diagram of a light emitting device and light emitting device units according to embodiment 1 of the present invention.

Figure 2:
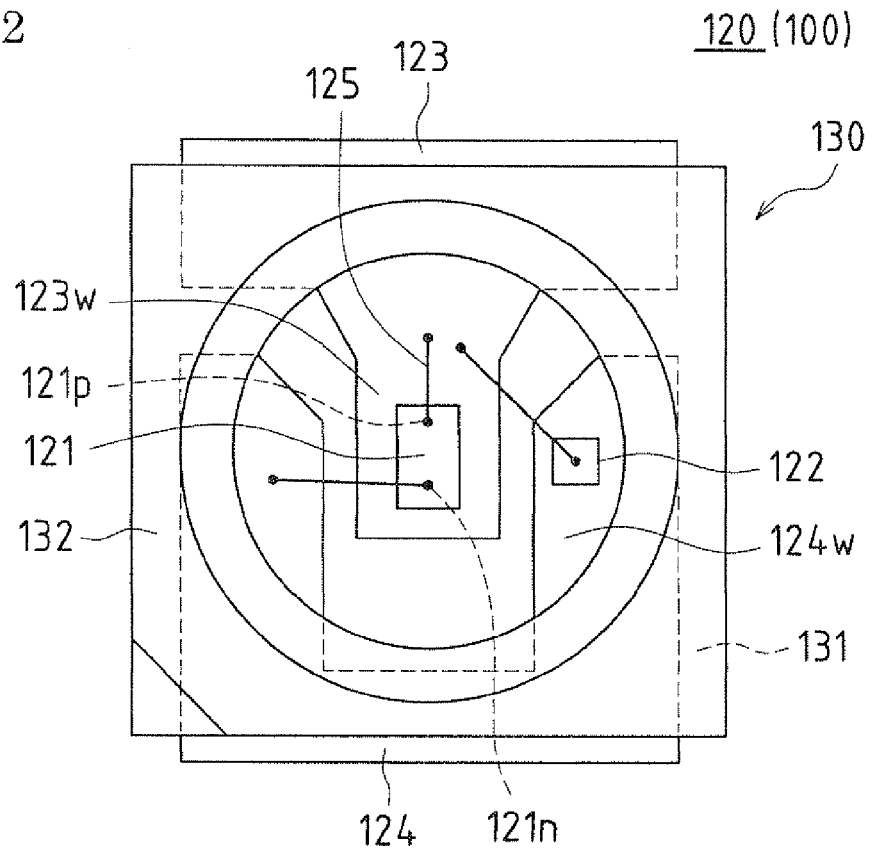
FIG. 2 is a plan view of a light emitting device unit, as seen on its light emitting surface side, which constitutes the light emitting device shown in FIG. 1.

FIG. 2 is a plan view of a light emitting device unit, as seen on its light emitting surface side, which constitutes the light emitting device shown in FIG. 1.

Figure 3:
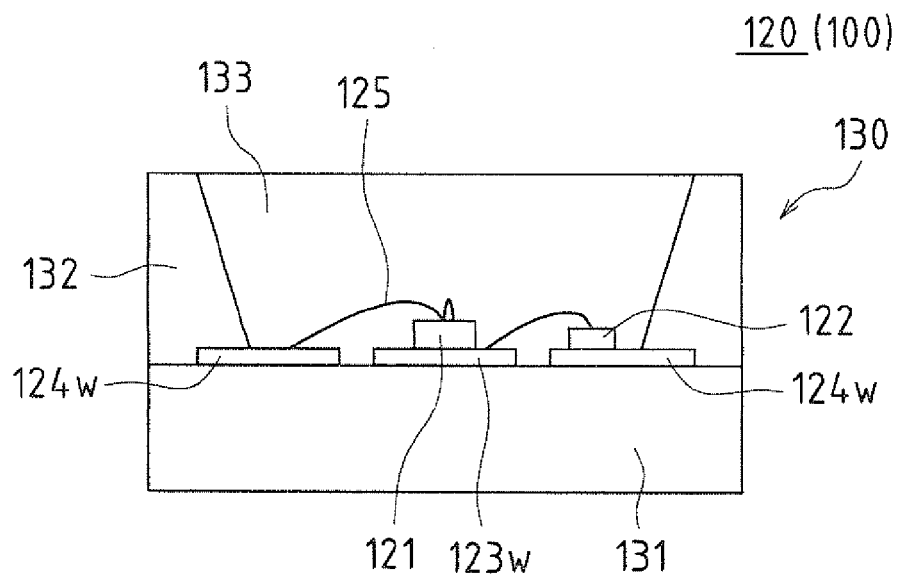

FIG. 3 is a see-through side view of the light emitting device unit shown in FIG. 2, with a center portion of the light emitting device unit made seen through.

A light emitting device 100 according to this embodiment includes light emitting device units 120 each including a substrate 131, semiconductor light emitting elements 121 disposed on the substrate 131, and resistors 122 coupled to the respective semiconductor light emitting elements 121.

In the light emitting device 100 according to this embodiment, each resistor 122 is coupled in parallel to a corresponding semiconductor light emitting element 121. The resistance of the resistor 122 is set at such a value that when a light emitting operation voltage for causing light emission of the semiconductor light emitting element 121 is applied to the semiconductor light emitting element 121, a current flowing through the resistor 122 is equal to or less than one-fiftieth of a current flowing through the semiconductor light emitting element 121.

This minimizes a counter-electromotive force that ambient light causes to the semiconductor light emitting element 121 when the semiconductor light emitting element 121 is in light-off state, thereby minimizing degradation of the semiconductor light emitting element 121. This also minimizes an increase in power consumption associated with the current that the light emitting operation voltage causes to flow through the resistor 122 when the semiconductor light emitting element 121 is in light-on state. This results in a light emitting device 100 with an elongated service life to improve reliability and with minimized energy loss.

The semiconductor light emitting element 121 includes an LED and will be hereinafter occasionally referred to as an LED 121. The LED uses a gallium nitride semiconductor light emitting element, which emits blue light. The primary light that the gallium nitride semiconductor light emitting element emits is blue light having an emission wavelength with an emission peak in a blue wavelength range of, for example, 400 nm to 500 nm.

The light emitting device 100 includes three first composite light emitting device units 110 that are coupled in parallel to each other between an output terminal 150a and an output terminal 150b of a power source 150. It should be noted that a light shield 160 is not included in the light emitting device 100; the light shield 160 is only used to schematically describe a light shield state of some of the LEDs 121 (e.g., the semiconductor light emitting element 121d). In the figure, the LED 121d is shielded from light. The figure indicates that the first composite light emitting device unit 110d includes the light-shielded LED 121d.

Each first composite light emitting device unit 110 includes eight light emitting device units 120 coupled to each other in series in the forward direction. Each light emitting device unit 120 includes an LED 121 and a resistor 122 (having the resistance, for example, R=1 MΩ) coupled in parallel to the LED 121. A preferable range of resistance of the resistor 122 will be described later. Examples of the resistor 122 include a chip resistor (a chip-shaped resistor).

The power source 150 can be represented by an equivalent circuit that includes a voltage source 151, a switch 153, and an output terminals-coupling parallel impedance 152. The output terminals-coupling parallel impedance 152 is coupled between the output terminal 150a and the output terminal 150b to electrically protect the first composite light emitting device units 110 while the switch 153 is in open state. Examples of the value of the output terminals-coupling parallel impedance 152 include Zps=14 kΩ.

(Configuration of the Light Emitting Device Unit)

The light emitting device unit 120 (see FIG. 2 and FIG. 3) includes: a package 130 defined by an insulating substrate 131 and an insulating frame 132 that sandwich metal wirings including a p-side terminal 123 (p-side terminal wiring 123w) and an n-side terminal 124 (n-side terminal wiring 124w); the LED 121; the resistor 122 coupled to the LED 121; and a fluorescent material-containing resin 133 over the LED 121.

The LED 121 includes, on its upper surface, a pair of pad electrodes including a p-side electrode 121p and an n-side electrode 121n, and is die bonded to a p-side terminal wiring 123w. The p-side electrode 121p and the n-side electrode 121n are respectively wire bonded to the p-side terminal wiring 123w and an n-side terminal wiring 124w with wires 125.

The resistor 122 includes a pair of electrodes respectively on the upper and lower surfaces of the resistor 122. The electrode on the lower surface is secured on the n-side terminal wiring 124w with a silver paste (not shown), while the electrode on the upper surface is wire bonded to the p-side terminal wiring 123w with a wire 125. The resulting state is that the LED 121 and the resistor 122 are coupled in parallel to each other.

Thus, the resistor 122 is a chip resistor 122 mounted on the substrate 131. This ensures highly productive mounting of the resistor 122 on the substrate 131, which simplifies the assembly process and facilitates fabrication of a diminishable light emitting device unit 120. Additionally, coupling a plurality of light emitting device units 120 to each other ensures an enlarged emitting device 100.

The LED 121 is covered by the fluorescent material-containing resin 133. The fluorescent material-containing resin 133 is a silicone resin in which green and red fluorescent materials are dispersed. The fluorescent materials absorb the blue light (primary light) emitted from the LED 121, which is made of a gallium nitride semiconductor light emitting element, and emit fluorescent light (secondary light). Thus, the light emitting device unit 120 mixes the primary light with the secondary light to emit white light.

More specifically, the fluorescent materials absorb the primary light and emit secondary light having an emission wavelength with an emission peak in a yellow wavelength range of, for example, 550 nm to 600 nm. Thus, the light emitting device unit 120 (light emitting device 100) is able to emit white light, which is a mixture of the primary light and the secondary light.

Suitable examples of the fluorescent materials include BOSE (Ba, O, Sr, Si, Eu). Other suitable examples than BOSE include, SOSE (Sr, Ba, Si, O, Eu), YAG (ceriumactivated yttrium-aluminum-garnet), α sialon ((Ca), Si, Al, O, N, Eu), and β sialon (Si, Al, O, N, Eu).

In place of the blue light emitting LED 121, it is possible to use an ultraviolet (near ultraviolet) LED having an emission wavelength with an emission peak in the range of 390 nm to 420 nm, in which case addition of a blue fluorescent material ensures a light source with high color renderability.

Examples of the substrate 131 and the frame 132 include polyphthalamide (PPA). When the LED 121 used includes one electrode or two electrodes on the bottom surface, the electrode or electrodes may be coupled to the terminals at the bottom surface, instead of using the wire 125 (flip-chip mounting).

As described above, the light emitting device unit 120 is sealed in the single package 130. This facilitates handling of the light emitting device 100, which improves its reliability and exchangeability.

While in the above-described description the light emitting device unit 120 includes a single LED 121, this should not be construed in a limiting sense; it is also possible to couple a plurality of LEDs 121 in parallel to each other. Thus, the light emitting device unit 120 may include a plurality of LEDs 121 coupled in parallel to each other. This configuration enlarges the area of light emission and ensures a large light emitting device 100 with a large light emitting device unit 120.

(Reduction of Reverse Bias by Resistor Coupled in Parallel)

The inventors have found out the following possibility. As in the light emitting device 100 (light emitting device unit 120), individually coupling the resistor 122 in parallel to the LED 121 minimizes photovoltage caused by ambient light, resulting in minimized applied to a particular LED 121 (e.g., LED 121*d*). The inventors conducted an evaluation to verify this effect.

When the first composite light emitting device unit 110 was irradiated with ambient light of 100,000 lx, the open voltage (with the resistor 122 removed) caused by the photovoltage was approximately 2 V per LED. Contrarily, when the resistor 122 was coupled in parallel to the LED 121 at resistance R=10 MΩ, the photovoltage was 0.5 V. At resistance R=1 MΩ, the photovoltage dropped to 0.05V.

This is applied to the first composite light emitting device unit 110 (e.g., first composite light emitting unit 110*d*), which includes eight light emitting device units 120 each including the resistor 122 and the LED 121 coupled in parallel to one another. When the first composite light emitting device unit 110 is irradiated with ambient light while one of the LEDs 121 (specifically, the LED 121*d*) is shielded from light, the reverse bias applied to the LED 121*d* is 0.5×7=3.5 V at resistance R=10 MΩ. At resistance R=1 MΩ, the reverse bias is reduced to 0.35 V.

A possible worst condition of reverse bias applied to the light-shielded LED 121*d*, that is, a condition under which the highest reverse bias can be applied is as follows. As described above, the first composite light emitting device unit 110*d* is irradiated with ambient light with the only light-shielded LED 121*d* exclusively receiving a sum of the photovoltages of the seven other LEDs 121 of the first composite light emitting device unit 110*d* because of their series coupling.

In usual operation state, the above-described condition under which the reverse bias is applied to the LED 121 probably somewhat lessens. Hence, the influence of the reverse bias is sufficiently reduced to a permissible level even when the resistance R is higher than R=1 MΩ, e.g., R=10 MΩ.

This example is under the assumption that when eight LEDs 121 are coupled to each other in series, the photovoltages of seven LEDs 121 are applied to the remaining one LED 121 (LED 121*d*). It is also possible that when three or more LEDs are coupled to each other in series, the photovoltages of two or more LEDs are applied to the remaining one LED. In this case, a possible open voltage to be applied is 2V (of photovoltage per LED)×2=4 V or more. In operation conditions such as those described above, the parallel coupling of the resistors 122 to the respective LEDs 121 according to this embodiment serves the effect of reducing reverse bias.

(Minimum Resistance and Range of Resistance)

The minimum resistance of the resistor 122 coupled in parallel to the LED 121 may be set at such a value that the current flowing through the resistor 122 is equal to or less than one-fiftieth, and moreover equal to or less than one-hundredth, of the current flowing through the LED 121. This keeps the energy loss at the resistor 122 equal to or less than a few percent (e.g., equal to or less than 2% in the case of equal to or less than one-fiftieth), or equal to or less than 1% (e.g., in the case of equal to or less than one-hundredth). That is, setting the resistance R to ensure a current flow on the above-described levels reduces the energy loss at the resistor 122 to a permissible level within a permissible range.

For example, it is assumed that when a driving voltage (light emitting operation voltage) of 3 V is applied to a terminal of the LED 121 (gallium nitride semiconductor light emitting element) coupled in parallel to the resistor 122, then a current of 20 mA flows through the LED 121 and a current of one-hundredth of the current flowing through the LED 121 flows through the resistor 122. Under this assumption, Ohm's law shows that the resistor 122 has the resistance R=3 (V)/0.0002 (A)=15 kΩ. At resistance R=150 kΩ, only the current flowing through the resistor 122 is only one-thousandth of the current flowing through the LED 121, whereby the energy loss is further reduced.

In view of these circumstances, the minimum value of the resistor 122 (resistance R) may be set at 15 kΩ. That is, the resistance R of the resistor 122 is preferably equal to or more than 15 kΩ. At equal to or more than 150 kΩ, the energy loss is further reduced.

As described above, at a lower resistance R, the reverse bias reduces leading to improvement of the effect of minimizing the degradation of the LED 121. However, this involves a higher energy loss.

In view of this, the resistance R is preferably determined considering the circuit configuration and application conditions of the light emitting device 100. For example, when a large number of LEDs 121 are coupled to each other in series in the first composite light emitting device unit 110, the reverse bias is probably at a high level because of the addition of the photovoltages caused by ambient light that are equivalent to the number of the series couplings. In this case, the resistance R is preferably set at a low level.

Accordingly, it is necessary to consider both the effect of reducing the reverse bias by the resistor 122 and the minimization of energy loss by the resistor 122.

Thus, it is preferred in this embodiment that the LED 121 is a gallium nitride semiconductor light emitting element, and the resistance R of the resistor 122 is equal to or more than 15 kΩ and equal to or less than 10 MΩ. This configuration minimizes an increase in power consumption at the resistor 122 coupled in parallel to the respective gallium nitride semiconductor light emitting element when it is in light-on state, and minimizes a counter-electromotive force caused by ambient light when the gallium nitride semiconductor light emitting element is in light-off state.

Furthermore, the resistance R of the resistor 122 is preferably equal to or more than 150 kΩ and equal to or less than 1 MΩ. This configuration more reliably minimizes power consumption when the gallium nitride semiconductor light emitting element is in light-on state, and more reliably minimizes a counter-electromotive force when the gallium nitride semiconductor light emitting element is in light-off state.

(Reliability of Light Emitting Device)

The light emitting device 100 according to this embodiment was put to a reliability test under similar conditions to those associated with the light emitting device 300 of the comparative example. Specifically, the only LED 121d of the first composite light emitting device unit 110 (light emitting device unit 120) was kept in a light-shielded state when ambient light was radiated to the light emitting device 100.

In this state, the light emitting device 100 was put into operation as an LED illumination source for 3000 hours. The light emitting device 100 was unlit during daytime, with the switch 153 open, and was lit during the evening, with the switch 153 closed. As a result, the light emitting device 100 (LED 121d) operated stably, with no failure found. Thus, the effect of minimizing the degradation of the LED 121d was confirmed.

In the light emitting device 100, when the switch 153 is closed to permit ambient light onto the first composite light emitting device unit 110 (the first composite light emitting device unit 110d) with the only LED 121d shielded from light, then the reverse bias applied to the LED 121d is estimated at 0.05 V×7=0.35 V with the resistance R of the resistor 122 at 1 MΩ. This is presumably a cause that minimized degradation of the LED 121d.

In FIG. 2, the resistor 122 is disposed in the package 130. Even when the resistor 122 is disposed outside the package 130 and coupled in parallel to the LED 121, a similar effect of minimizing reverse bias results.

Still, disposing the resistor 122 in the light emitting device unit 120 provides an effect of minimizing electrostatic breakdown of the light emitting device unit 120 during handling.

The light emitting device 100 includes first composite light emitting device units 110 each including three or more light emitting device units 120 coupled to each other in series. With this configuration, the light emitting device 100 includes a first composite light emitting device unit 110 including three or more, individually packaged light emitting device units 120 that are coupled to each other in the form of a string. This ensures a desired length for the light emitting device 100.

The light emitting device 100 includes the power source 150 that supplies the light emitting device units 120 (first composite light emitting device units 110) with a direct current. This configuration ensures stable operation of the light emitting device 100 of high reliability and low energy loss.

As has been described hereinbefore, the light emitting device unit 120 includes a substrate 131, a semiconductor light emitting element 121, and a resistor 122. The semiconductor light emitting element 121 is disposed on the substrate 131. The resistor 122 is coupled to the semiconductor light emitting element 121. The resistor 122 is coupled in parallel to the semiconductor light emitting element 121. The resistor 122 has a resistance R set at such a value that when a light emitting operation voltage for causing light emission of the semiconductor light emitting element 121 is applied to the semiconductor light emitting element 121, a current flowing through the resistor 122 is equal to or less than one-fiftieth of a current flowing through the semiconductor light emitting element 121.

This minimizes a counter-electromotive force that ambient light causes to the semiconductor light emitting element 121 (e.g., semiconductor light emitting element 121d) when the semiconductor light emitting element 121 is in light-off state, thereby minimizing degradation of the semiconductor light emitting element 121. This also minimizes an increase in power consumption associated with the current that the light emitting operation voltage causes to flow through the resistor 122 when the semiconductor light emitting element 121 is in light-on state. This results in a light emitting device unit 120 with an elongated service life to improve reliability and with minimized energy loss.

In the light emitting device unit 120 according to this embodiment, the resistor 122 may use a thick film resistor formed by printing as in embodiment 2. Moreover, the light emitting device unit 120 according to this embodiment may include a wiring electrode (corresponding to wiring electrodes 226 in embodiment 2) and a recognition pattern (corresponding to a recognition pattern 280 in embodiment 2) formed by printing.

Embodiment 2

A light emitting device and a light emitting device unit according to this embodiment will be described by referring to FIG. 4 and FIG. 5. The basic configuration is similar to that in embodiment 1 and thus will not be elaborated here.

Figure 4:
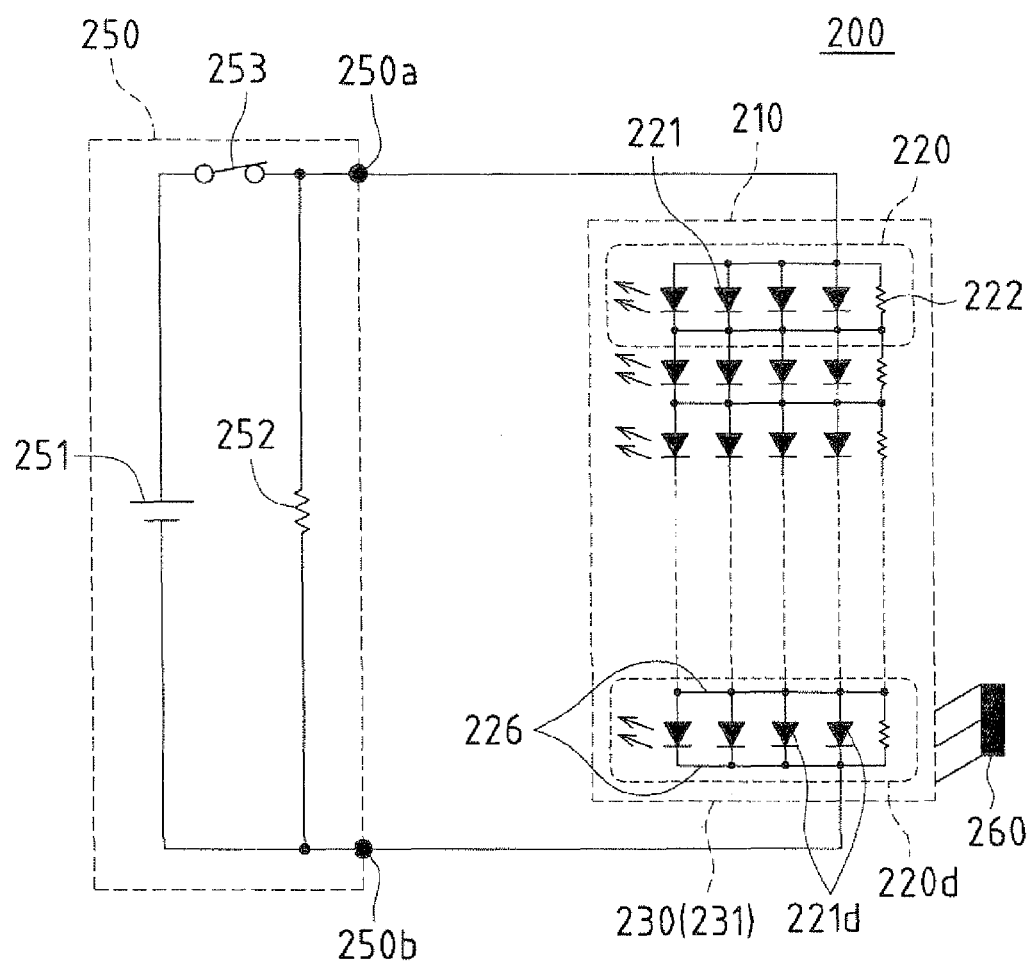
FIG. 4 is a circuit diagram of a light emitting device and light emitting device units according to embodiment 2 of the present invention.

FIG. 4 is a circuit diagram of a light emitting device and light emitting device units according to embodiment 2 of the present invention.

Figure 5:
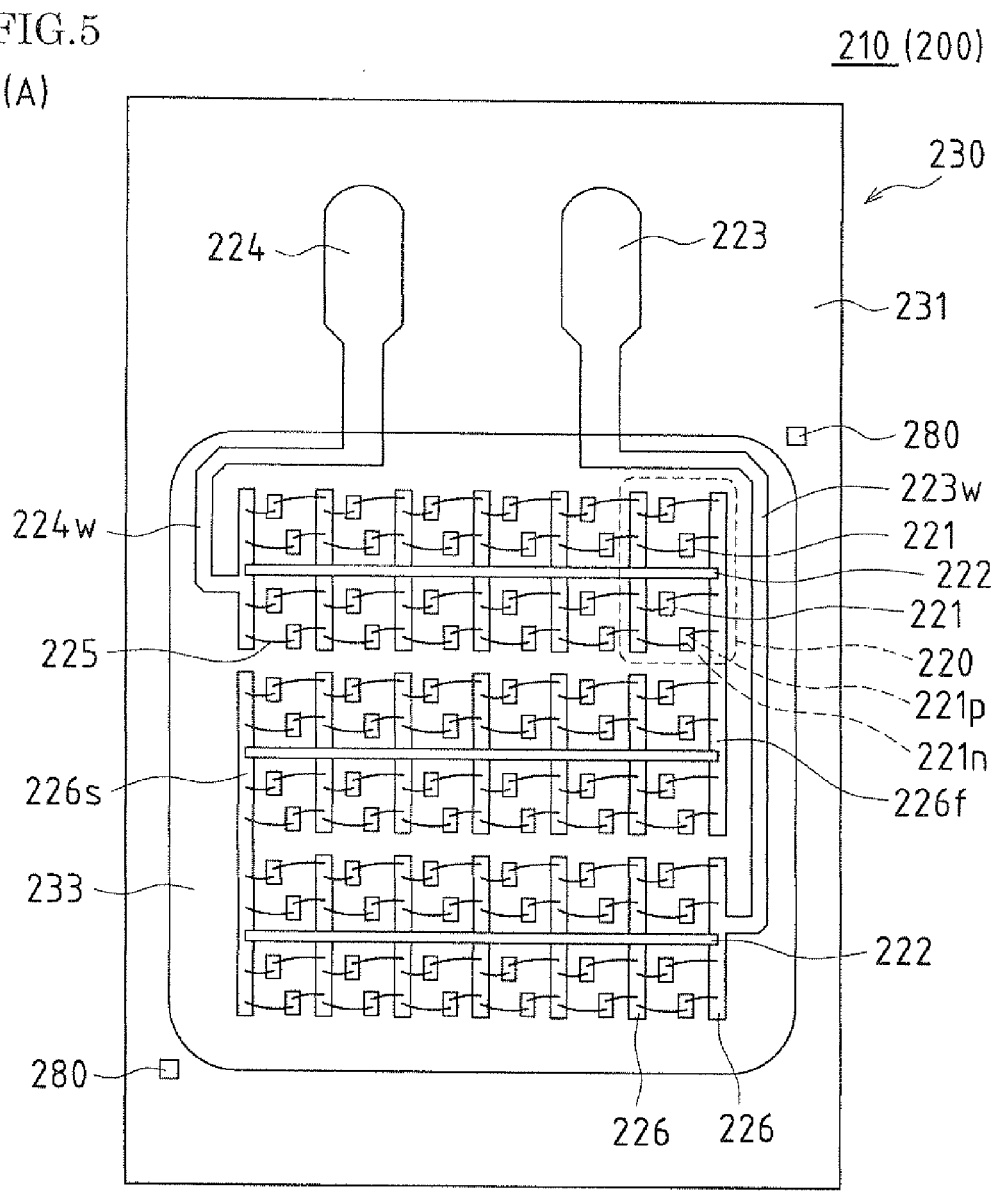
FIG. 5 is a diagram illustrating a light emitting device unit and a second composite light emitting device unit that constitute the light emitting device shown in FIG. 4, with (A) showing a plan view to illustrate a plan condition as seen on the light emitting surface side, and (B) showing an enlarged see-through side view to illustrate an enlarged side surface condition as seen through from arrow B of (A).
Figure 5:
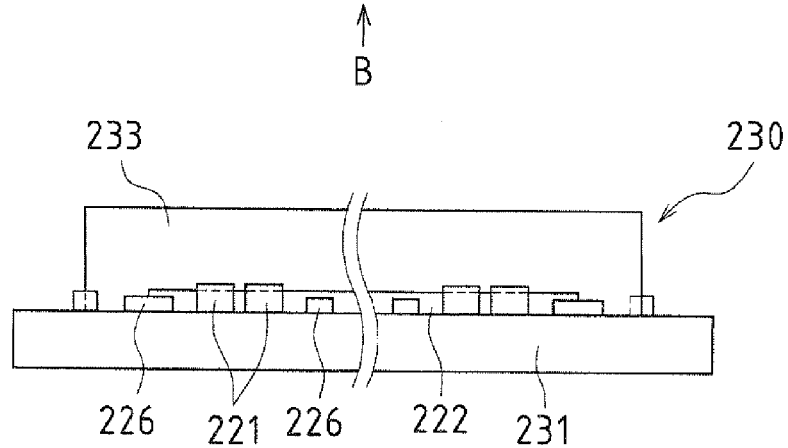

FIG. 5 is a diagram illustrating a light emitting device unit and a second composite light emitting device unit that constitute the light emitting device shown in FIG. 4, with (A) showing a plan view to illustrate a plan condition as seen on the light emitting surface side, and (B) showing an enlarged see-through side view to illustrate an enlarged side surface condition as seen through from arrow B of (A).

A light emitting device 200 according to this embodiment includes light emitting device units 220 each including a substrate 231, light emitting elements 221 on the substrate 231, and a resistor 222 coupled to the semiconductor light emitting elements 221. In the following description, each semiconductor light emitting element 221 will be occasionally referred to as an LED 221.

In the light emitting device 200 according to this embodiment, the resistor 222 is coupled in parallel to each LED 221. The resistor 222 has a resistance set at such a value that when a light emitting operation voltage for causing light emission of the semiconductor light emitting element 221 is applied to the semiconductor light emitting element 221, a current flowing through the resistor 222 is equal to or less than one-fiftieth of a current flowing through the semiconductor light emitting element 221.

This minimizes a counter-electromotive force that ambient light causes to the LED 221 when the LED 221 is in light-off state, thereby minimizing degradation of the LED 221. This also minimizes an increase in power consumption associated with the current that the light emitting operation voltage causes to flow through the resistor 222 when the LED 221 is in light-on state. This results in a light emitting device 200 with an elongated service life to improve reliability and with minimized energy loss.

The LED 221 is similar to the semiconductor light emitting element 121 (LED 121) in embodiment 1, and the resistance R of the resistor 222 is similar to the resistance R of the resistor 122 in embodiment 1.

Specifically, it is preferred that the LED 221 is a gallium nitride semiconductor light emitting element, and the resistance R of the resistor 222 is equal to or more than 15 kΩ and equal to or less than 10 MΩ. This configuration minimizes an increase in power consumption at the resistor 222 coupled in parallel to the respective gallium nitride semiconductor light emitting element when it is in light-on state, and minimizes a counter-electromotive force that ambient light causes to the gallium nitride semiconductor light emitting element when it is in light-off state.

Furthermore, the resistance R of the resistor 222 is preferably equal to or more than 150 kΩ and equal to or less than 1 MΩ. This configuration more reliably minimizes power consumption when the gallium nitride semiconductor light emitting element is in light-on state, and more reliably minimizes a counter-electromotive force when the gallium nitride semiconductor light emitting element is in light-off state.

In the light emitting device 200 according to this embodiment, each of the light emitting device units 220 includes four LEDs 221 and a resistor 222 coupled in parallel to each other on a pair of wiring electrodes 226. Eighteen light emitting device units 220 are coupled to each other in series to constitute a second composite light emitting device unit 210. That is, in the light emitting device unit 220, a plurality of LEDs 221 are coupled in parallel to each other. This enlarges the area of light emission and ensures a large light emitting device 200.

In the light emitting device 200, the second composite light emitting device unit 210 includes three or more light emitting device units 220 (LEDs 221) coupled to each other in series, and is disposed on the substrate 231. Thus, the light emitting device 200 includes a second composite light emitting device unit 210 including three or more light emitting device units 220 coupled to each other in series on the same substrate. This ensures a light emitting device 200 with high packaging density (light emission density).

The second composite light emitting device unit 210 is covered by a fluorescent material-containing resin 233, thus being sealed in a package 230. Specifically, the second composite light emitting unit 210 is sealed in the single package 230. This facilitates handling of the light emitting device 200, which improves its reliability and exchangeability.

The planer area of the light emitting device 200 is defined by the substrate 231. In this embodiment, the light emitting device has a rectangular shape of 20 mm×30 mm.

The wiring electrodes 226 are intermediate electrodes serving as intermediate lines for coupling a light emitting device unit 220 in series to another light emitting device unit 220 and for coupling adjacent light emitting device units 220. Specifically, the wiring electrodes 226 are formed such that four LEDs 221 and the resistor 222 are disposed between a pair of wiring electrodes 226. Accordingly, one of the pair of wiring electrodes 226 is commonly used (shared) by adjacent light emitting device units 220.

The resistor 222 is a thick film resistor formed on the substrate 231. This configuration ensures highly productive formation of the resistor 222 on the substrate 231, which simplifies the assembly process and thus facilitates manufacture of large light emitting devices 200 (second composite light emitting device units 210). The resistor 222 of the light emitting device unit 220 has the resistance R=100 kΩ. The term thick film resistor refers to a resistor formed by sintering a thick film resistor paste transcribed by printing.

Thus, the light emitting device 200 includes the wiring electrodes 226 to which the LEDs 221 and the resistor 222 (thick film resistor) are coupled. The wiring electrodes 226 are disposed in parallel to each other so that the LEDs 221 are disposed between adjacent wiring electrodes 226. The resistor 222 (thick film resistors) crosses the wiring electrodes 226. This ensures a light emitting device 200 in which the LEDs 221, the wiring electrodes 226, and the resistor 222 (thick film resistor) are accurately arranged so as to emit uniform light over a large area.

The wiring electrodes 226 are disposed in parallel to the longer sides of the substrate 231 to form a streaky pattern of seven lines and three rows. A p-side terminal 223 and an n-side terminal 224 are disposed along one of the shorter sides of the substrate 231.

Outermost wiring electrodes 226f and 226s of the center row of the three rows extend to different adjacent rows so as to couple the lighting device units 220 in series to the wiring electrodes 226 of the respective adjacent rows. More specifically, the outermost wiring electrode 226f on the right side is integrally formed with the wiring electrode 226 in the upper row, while the outermost wiring electrode 226s on the left side is integrally formed with the wiring electrode 226 in the lower row.

The resistor 222 crosses the center of the wiring electrodes 226. This minimizes variation of the influence that the resistor has on the plurality of LEDs 221 coupled in parallel to each other, thus uniformizing the influence.

The wiring electrode 226 that is outside the upper row and separated from the center row is integrally coupled to and formed with the n-side terminal wiring 224w. The wiring electrode 226 that is outside the lower row and separated from the center row is integrally coupled to and formed with the p-side terminal wiring 223w. Thus, the second composite light emitting device 210 is formed.

The resistors 222 are disposed in parallel to the shorter sides of the substrate 231 to form a streaky pattern of three lines, and each cross approximately the center of the plurality of wiring electrodes 226. The resistors 222 are coupled to the wiring electrodes 226 at portions of intersection.

At the time when the wiring electrodes 226 or the resistors 222 (thick film resistors) are formed, recognition patterns 280 may be formed on some parts of the surface of the substrate 231. The recognition patterns 280 are used for positioning in steps such as die bonding and wire bonding, described later. This improves workability in the fabricating steps and facilitates the attempt to improve accuracy.

With the light emitting device 200 according to this embodiment, the following is assumed. Ambient light is radiated to the second composite light emitting device unit 210, which is coupled between an output terminal 250a and an output terminal 250b of a power source 250 (the power source 250 can be represented by an equivalent circuit that includes a voltage source 251, a switch 253, and an output terminals-coupling parallel impedance 252). One light emitting device unit 220d (four LEDs 221d) is shielded from light by a light shield 260.

Even when the switch 253 is open, a closed circuit is formed by the resistor 252. In this state, when the photovoltage that ambient light causes in each of the other light emitting device units 220 is 0.015 V, the reverse bias applied to the light-shielded light emitting device unit 220d is as low as 0.015 V×1÷0.2515 V. Thus, the LEDs 221d undergo minimized degradation.

The second composite light emitting device unit 210 (light emitting device 220) includes the substrate 231, the LEDs 221 die bonded to the substrate 231, and the fluorescent material-containing resins 233 over the LEDs 221.

The substrate 231 is mainly made of materials including a ceramic, a resin, and a metal insulated on the surface. Formation of the thick film resistors (resistors 222) and the electrodes (wiring electrodes 226) involves sintering. In view of this, a ceramic substrate such as an alumina substrate is particularly preferred for being a material with high heat resistance and reflectivity.

On the surface of the substrate 231, the p-side terminal 223, the n-side terminal 224, and the wiring electrodes 226 are formed to supply power from the power source 250. Also on the surface of the substrate 231, the p-side terminal wiring 223w is formed to couple the p-side terminal 223 to the wiring electrode 226, and the n-side terminal wiring 224w is formed to couple the n-side terminal 223 to the wiring electrode 226. Additionally, the resistors 222 serving as thick film resistors are formed to cross the plurality of wiring electrodes 226 as if to couple them to each other, similarly to the wirings.

The LEDs 221 are die bonded to the substrate 231 with a brazing filler material, an adhesive agent, or other material. A p-side electrode 221p and an n-side electrode 221n are pad electrodes formed on the surface of the LED 221, and are wire bonded through wires 225 to the wiring electrodes 226, which are formed on the surface of the substrate 231.

The LED 221 is covered by the fluorescent material-containing resin 233. The fluorescent material-containing resin 233 may be similar to the fluorescent material-containing resin portion 133 in embodiment 1, and thus will not be elaborated here.

While a thick film resistor is exemplified as the resistor 222 formed on the substrate 231, the thick film resistor should not be construed in a limiting sense. For example, the resistor 222 may be a chip resistor mounted on the substrate 231, similarly to the resistor 122 (chip resistor) in embodiment 1. This ensures highly productive mounting of the resistor 222 on the substrate 231, which simplifies the assembly process and facilitates fabrication of a light emitting device 200 of any desired size.

That is, a preferred configuration is that the resistor 222 is coupled in parallel to the LED 221 to bypass the photovoltage caused by ambient light incident on the second composite light emitting device unit 210, which forms an LED string, thereby reducing the reverse bias applied to the LED 221d.

The light emitting device unit 220 may include only one LED 221 to constitute the second composite light emitting device unit 210, similarly to embodiment 1.

The light emitting device 200 includes the power source 250 that supplies the light emitting device units 220 (second composite light emitting device unit 210) with a direct current. This configuration ensures stable operation of the light emitting device 200 of high reliability and low energy loss.

As has been described hereinbefore, the light emitting device unit 220 includes a substrate 231, a semiconductor light emitting element 221, and a resistor 222. The semiconductor light emitting element 221 is disposed on the substrate 231. The resistor 222 is coupled to the semiconductor light emitting element 221. The resistor 222 is coupled in parallel to the semiconductor light emitting element 221. The resistor 222 has a resistance set at such a value that when a light emitting operation voltage for causing light emission of the semiconductor light emitting element 221 is applied to the semiconductor light emitting element 221, a current flowing through the resistor 222 is equal to or less than one-fiftieth of a current flowing through the semiconductor light emitting element 221.

This minimizes a counter-electromotive force that ambient light causes to the semiconductor light emitting element 221 (e.g., semiconductor light emitting element 221d) when the semiconductor light emitting element 221 is in light-off state, thereby minimizing degradation of the semiconductor light emitting element 221. This also minimizes an increase in power consumption associated with the current that the light emitting operation voltage causes to flow through the resistor 222 when the semiconductor light emitting element 221 is in light-on state. This results in a light emitting device unit 220 with an elongated service life to improve reliability and with minimized energy loss.

Embodiment 3

Referring to FIG. 6A through FIG. 6G, a third embodiment (method for fabricating the light emitting device, method for fabricating the second composite light emitting device unit) will be described as a method (fabrication process) for fabricating the light emitting device 200 (second composite light emitting device unit 210) according to embodiment 2. The light emitting device 200 in FIG. 6B through FIG. 6G is shown for the purpose of describing the steps and thus in a simplified form.

FIG. 6A is a flowchart schematically showing a method for fabricating a light emitting device, according to embodiment 3 of the present invention.

The method for fabricating the light emitting device 200 includes step S1 (separation groove forming step) through step S9 (dam sheet removing step).

Figure 6C:
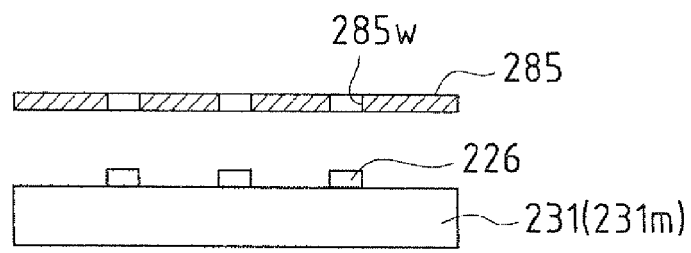
FIG. 6C is a diagram illustrating a condition of the substrate in the wiring electrode forming step shown in FIG. 6A, with (A) showing a side view of the substrate and a cross-sectional view of a screen mask, and (B) showing a plan view of the substrate with wirings formed thereon.
Figure 6C:
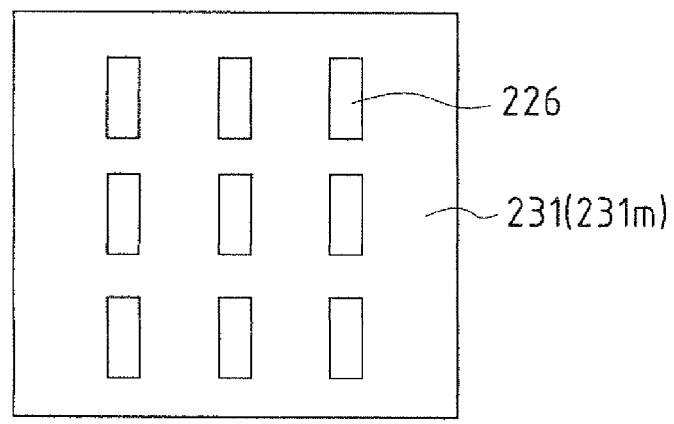

Specifically, step S1 is a separation groove forming step shown in FIG. 6B. Step S2 is a wiring electrode forming step (wire printing, drying, and sintering step) shown in FIG. 6C. Step S3 is a resistor forming step (resistor printing, drying, and sintering step) shown in FIG. 6D. Step S4 is a substrate separating step shown in FIG. 6D. Step S5 is a die bonding step and step S6 is a wire bonding step shown in FIG. 6E. Step S7 is a dam sheet attaching step and step S8 is an LED covering step shown in FIG. 6F. Step S9 is a dam sheet removing step shown in FIG. 6G.

Step S1:

FIG. 6B is a diagram illustrating a condition of a substrate in the separating groove forming step shown in FIG. 6A, with (A) showing a side view of the substrate and (B) showing a plan view to illustrate a groove-formed surface of the substrate.

The substrate 231 is formed by separating a single large mother substrate 231m in Step S4. In the preceding steps, the large mother substrate 231m, which is a group of substrates 231, is treated as a unit of processing in view of productivity and workability. In this step, separating grooves 282 are formed on the front or rear surface of the mother substrate 231m by a method such as a half dice method in a manner that defines outer shapes of the substrates 231 (separating groove forming step).

It should be noted that from FIG. 6C on, a separate substrate 231 is shown instead of the mother substrate 231m, for the sake of illustration.

Step S2:

FIG. 6C is a diagram illustrating a condition of the substrate in the wiring electrode forming step shown in FIG. 6A, with (A) showing a side view of the substrate and a cross-sectional view of a screen mask, and (B) showing a plan view of the substrate with wirings formed thereon. It is noted that the screen mask is hatched for clarity of openings 285w.

A screen 285 with a conductor pattern (openings 285w) is placed on the substrate 231 (mother substrate 231m). A conductor paste is printed on the substrate 231. Then the substrate 231 is dried and sintered in a 950° C. atmosphere. Thus, wirings (p-side terminal 223, p-side terminal wiring 223w, n-side terminal 224, n-side terminal wiring 224w, and wiring electrodes 226) are formed (wiring electrode forming step).

The wirings intended in the conductor patterning include the p-side terminal 223, the p-side terminal wiring 223w, the n-side terminal 224, the n-side terminal wiring 224w, and the wiring electrodes 226. In FIG. 6C, the wiring electrodes 226 are shown as representative essential electrodes.

The screen 285 shown in step S2 is formed of a thin metal sheet such as of stainless and has a perforated pattern corresponding to desired wirings (conductor pattern) so as to form the pattern on the substrate 231.

Examples of the conductive paste include a Ag/Pd paste. The Ag/Pd paste contains a solvent and components dispersed therein, main components including Ag powder, Pd powder, oxide additive, low melting glass powder such as borosilicate glass, and cellulose organic binder.

Figure 6D:
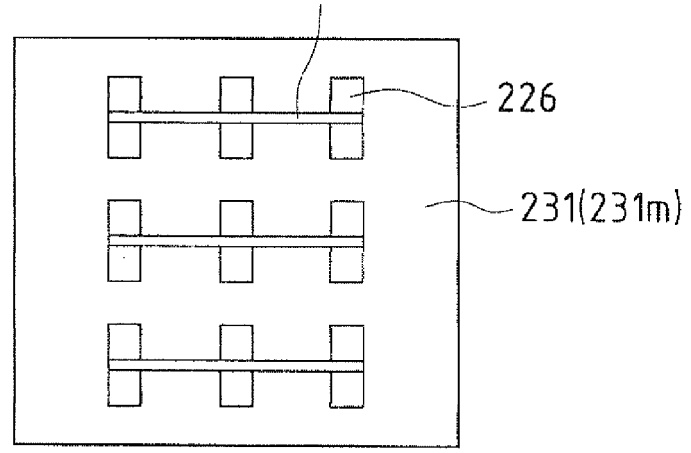
FIG. 6D is a diagram illustrating a surface condition of the substrate in the resistor forming step shown in FIG. 6A.

Step S3:

FIG. 6D is a diagram illustrating a surface condition of the substrate in the resistor forming step shown in FIG. 6A.

On a surface of the substrate 231 (mother substrate 231*m*), a screen (not shown) with a perforated resistor pattern is placed. A resistive paste is printed on the substrate 231. The substrate 231 is then dried and sintered in a 850° C. atmosphere. Thus, thick film resistors as the resistors 222 are formed (resistor forming step). The resistors 222 extend in a direction that crosses the wiring electrodes 226.

Similarly to the screen used in step S2, the screen used in this step is formed of a thin metal sheet such as of stainless and has a perforated pattern corresponding to the wirings.

When the sintering temperatures for the conductive paste and the resistor pattern are similar, step S2 and step S3 may be executed simultaneously in some cases, thus simultaneously fanning the electrodes (p-side terminal 223, p-side terminal wiring 223*w*, n-side terminal 224, p-side terminal wiring 224*w*, and wiring electrodes 226) and the resistors (resistors 222).

Examples of the resistor paste include a Ru paste for example. The Ru paste mainly includes RuO2 and provides a sheet resistance in the range of 10Ω/□ to 10 MΩ/□.

Rectangular wiring electrodes 226 are arranged in a matrix with the resistors 222 arranged to cross respective rows of the wiring electrodes 226. Then, the outermost wiring electrodes 226 are suitably coupled to other wirings, thus forming the second composite light emitting device unit 210 (light emitting device 200).

In step S2 and step S3, recognition patterns 280 may be formed on some parts of the surface of the substrate 231. The recognition patterns 280 are used for positioning in steps such as die bonding and wire bonding, described later.

The recognition pattern 280 may be made of the material of the electrode 226 or the material of the resistor 222 (thick film resistor), and thus may be simultaneously formed with the formation of the wiring electrode 226 or the resistor 222 by screen printing.

Thus, the substrate 231 includes the recognition patterns 280 to serve as markers in the fabrication process. The recognition patterns 280 are made of the same material as the material of the wiring electrodes 226 or the material of the thick film resistors (resistors 222). This ensures that the recognition patterns 280 used in mounting of the LED 221 are easily formed together with the wiring electrodes 226 or the thick film resistors (resistors 222). This results in a highly productive light emitting device 200.

The positioning using the recognition patterns 280 usually involves a step of recognizing the patterns (recognition patterns 280) on the surface of the substrate 231 using imaging means such as a CCD camera. The recognition patterns 280 are more easily recognized if they have a clearer contrast to the substrate 231. In view of this, the recognition patterns 280 are more preferably formed simultaneously with the formation of the thick film resistors 222 having a color that provides a clearer contrast.

Figure 6E:
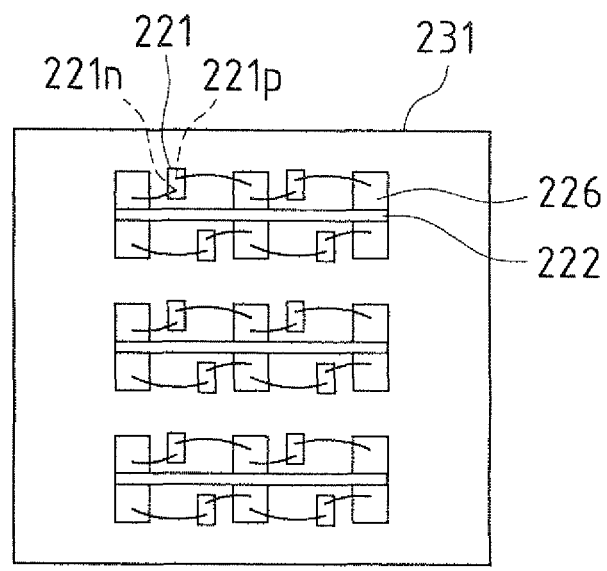
FIG. 6E is a plan view to illustrate a surface condition after the substrate separating step, the die bonding step, and the wire bonding step shown in FIG. 6A.

FIG. 6E is a plan view to illustrate a surface condition after the substrate separating step, the die bonding step, and the wire bonding step shown in FIG. 6A.

Step S4:

The mother substrate 231*m* is separated into individual substrates 231 (substrate separating step). A method of the separation is use of a cutter or like means to vertically cut a substrate 231 on separation grooves 282 formed on the substrate 231. This separates the substrate along the separating grooves 282, thus facilitating the separation.

Step 5:

The LEDs 221 are die bonded on the separated substrate 231 (die bonding step). Four LEDs 221 are die bonded between a pair of adjacent wiring electrodes 226 (see FIG. 5). Thus, this step is a semiconductor light emitting element arranging step in which the semiconductor light emitting elements 221 are arranged between a pair of wiring electrodes 226.

In the die bonding, the LEDs 221 are arranged in a zigzag pattern. Specifically, the LEDs 221 are die bonded while being shifted away from each other to avoid confrontation of the sides of adjacent LEDs 221. This arrangement minimizes mutual absorption or shielding of outgoing light of adjacent LEDs, thereby improving light retrieval efficiency.

Step 6:

The die bonded LEDs 221 are subjected to wire bonding (wire bonding step).

Specifically, the electrodes (n-side electrode 221*n* and p-side electrode 221*p*) of each LED 221 are coupled to the wiring electrodes 226 by wire bonding, thus forming the second composite light emitting device unit 210 in which the light emitting device units 220 are arranged in series. Thus, this step is a light emitting device unit forming step in which the electrodes of the semiconductor light emitting elements 221 are coupled to the wiring electrodes 226 to form the light emitting device units 220.

One of the pair of wiring electrodes 226 is commonly used by adjacent light emitting device units 220.

Figure 6F:
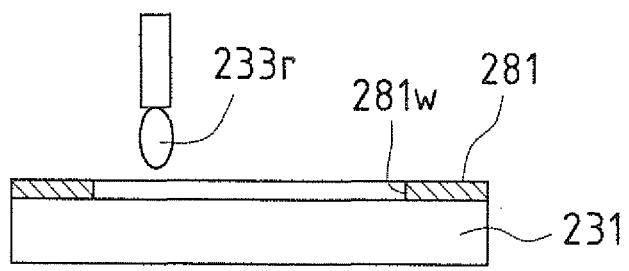
FIG. 6F is a side view of the substrate illustrating its side surface condition in the dam sheet attaching step and the LED covering step shown in FIG. 6A.

FIG. 6F is a side view of the substrate illustrating its side surface condition in the dam sheet attaching step and the LED covering step shown in FIG. 6A. It is noted that the dam sheet is hatched for clarity of a through hole 281*w*.

Step 7:

Before the LEDs 221 are covered by a fluorescent material-containing resin 233*r*, the dam sheet 281 as a dam member is attached on the surface of the substrate 231, on which the LEDs 221 are die bonded (dam sheet attaching step).

The dam sheet 281 includes a through hole 281*w* in which the LEDs 221 (light emitting device unit 220, the second composite light emitting device unit 210) are accommodated. The through hole 281*w* is in a shape that defines the fluorescent material-containing resin portion 233 (see FIG. 5). Thus, the dam sheet 281 serves as a dam that prevents the fluorescent material-containing resin 233*r* put in the through hole 281*w* from spreading beyond the dam sheet 281.

The dam sheet 281 is formed of a resin sheet such as Teflon (registered trademark) and fluoro-rubber with an adhesive material applied on a surface to be attached to the substrate 231. Fluoro-rubber is a preferred material for its high elasticity and high removability in the subsequent step.

Step S8:

The fluorescent material-containing resin 233*r* is introduced on the surface of the substrate 231 on which the dam sheet 281 is attached so as to fill the through holes 281*w*, thus covering the LEDs 221 (LED covering step). The fluorescent material-containing resin 233*r* contains a transparent resin such as silicone resin and a fluorescent material dispersed therein.

Figure 6G:
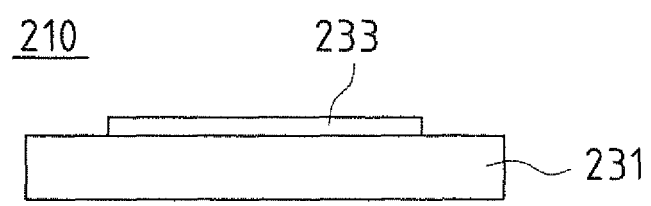
FIG. 6G is a diagram illustrating a condition of the substrate after the dam sheet removing step shown in FIG. 6A, with (A) showing a side view of the substrate and (B) showing a plan view of the substrate illustrating its surface with a fluorescent material-containing resin formed thereon.
Figure 6G:
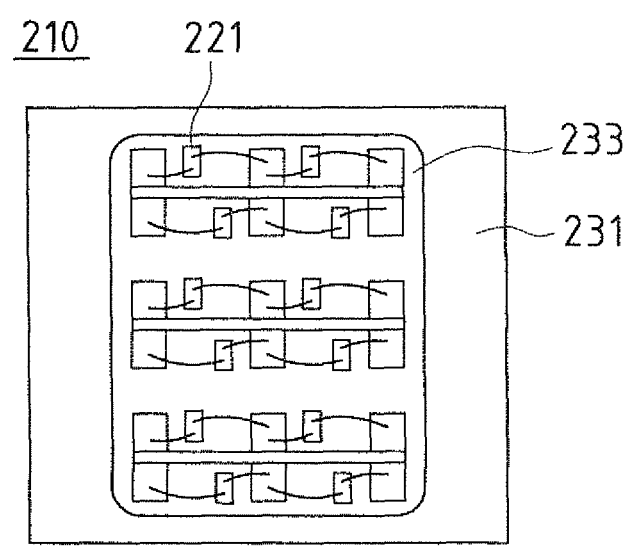

Step S9:

FIG. 6G is a diagram illustrating a condition of the substrate after the dam sheet removing step shown in FIG. 6A, with (A) showing a side view of the substrate and (B) showing a plan view of the substrate illustrating its surface with a fluorescent material-containing resin formed thereon.

The fluorescent material-containing resin $233r$ filled in the through holes $281w$ is cured at 150° C. for 120 minutes. Then, the dam sheet 281 is removed to form the fluorescent material-containing resin portions 233 (dam sheet removing step).

The dam sheet 281 is easily removed by peeling with a jig that grasps one end of the dam sheet 281. Part of the fluorescent material-containing resin $233r$ spreading out of the through hole $281w$ can be removed together with the dam sheet 281.

By the above-described fabrication process, the second composite light emitting device unit 210 (light emitting device 200) as shown in FIG. 6G (see FIG. 5) is formed.

As has been described hereinbefore, the method for fabricating a light emitting device according to this embodiment is a method for fabricating the light emitting device 200 that includes: the light emitting device units 220 each including the semiconductor light emitting elements 221 and the resistor 222; and the substrate 231 on which the light emitting device units 220 is disposed.

The method for fabricating a light emitting device according to this embodiment includes: a wiring electrode forming step of forming, by printing onto the substrate 231, a pair of wiring electrodes 226 to which the semiconductor light emitting elements 221 and the resistor 222 are to be coupled; a resistor forming step of forming the resistor 222 onto the substrate 231 by printing so that the pair of wiring electrodes 226 are coupled to each other; a semiconductor light emitting element arranging step of arranging each semiconductor light emitting element 221 between the pair of wiring electrodes 226; and a light emitting device unit forming step of coupling the electrodes of each of the semiconductor light emitting elements 221 to the wiring electrodes 226 so as to form the light emitting device unit 220.

Employing printing technology in forming the wiring electrodes 226 and the resistor 222 ensures highly productive fabrication of a large light emitting device 200.

In the method for fabricating a light emitting device according to this embodiment, a plurality of light emitting device units 220 are disposed in parallel to each other and are coupled to each other in series. The wiring electrodes 226 are disposed in parallel to each other so as to correspond to edge portions of each of the light emitting device units 220. One of a pair of wiring electrodes 226 is commonly used by adjacent light emitting device units 220. Each of the resistors 222 is extended in a direction to cross the wiring electrodes 226.

This ensures a highly dense arrangement of the light emitting device units 220 and the wiring electrodes 226, and facilitates fabrication of a light emitting device 200 having a large area.

The present invention can be executed in various other forms without departing from the spirit or major characteristics of the present invention. The embodiments described above are provided for exemplary purposes in every respect and should not be construed in a limiting sense. The scope of present invention is defined by the appended claims rather than by the foregoing description of the specification. Furthermore, the scope of the present invention is intended to embrace all such alternatives, modifications, and variations as fall within the scope of the claims, together with all equivalents thereof.

The present application claims priority to Japanese Patent Application No. 2009-049634 filed in Japan on Mar. 3, 2009. The contents of this application are incorporated herein by reference in their entirety. The contents of literature cited in this specification are incorporated herein by reference in their entirety.

INDUSTRIAL APPLICABILITY

The present invention is useful in providing a light emitting device, a light emitting device unit, and a method for fabricating the light emitting device that ensure reliability and minimizes energy loss.

REFERENCE SIGNS LIST

100 Light emitting device
110 First composite light emitting device unit
120 Light emitting device unit
121 Semiconductor light emitting element (LED)
$121n$ n-side electrode
$121p$ p-side electrode
122 Resistor (chip resistor)
123 p-side terminal
$123w$ p-side terminal wiring
124 n-side terminal
$124w$ n-side terminal wiring
125 Wire
130 Package
131 Substrate
132 Frame
133 Fluorescent material-containing resin
150 Power source
$150a$ Output terminal
$150b$ Output terminal
151 Voltage source
152 Output terminals-coupling parallel impedance
153 Switch
160 Light shield
200 Light emitting device
210 Second composite light emitting device unit
220 Light emitting device unit
221 Semiconductor light emitting element (LED)
$221n$ n-side electrode
$221p$ p-side electrode
222 Resistor (thick film resistor)
223 n-side terminal
$223w$ p-side terminal wiring
224 n-side terminal
$224w$ n-side terminal wiring
225 Wire
226 Wiring electrode
230 Package
231 Substrate
233 Fluorescent material-containing resin portion
250 Power source
$250a$ Output terminal
$250b$ Output terminal
251 Voltage source
252 Output terminals-coupling parallel impedance
253 Switch
260 Light shield
280 Recognition pattern
281 Dam sheet
$281w$ Through hole
285 Screen
$285w$ Opening

The invention claimed is:

1. A light emitting device comprising a plurality of light emitting device units disposed in series, each of the plurality of light emitting device units comprising:
 a substrate; at least one semiconductor light emitting element disposed on the substrate; and
 a resistor coupled to the at least one semiconductor light emitting element,
  wherein the resistor is coupled in parallel to the at least one semiconductor light emitting element,
  wherein the resistor has a resistance set at such a value that when a light emitting operation voltage for causing light emission of the at least one semiconductor light emitting element is applied to the at least one semiconductor light emitting element, a current flowing through the resistor is equal to or less than one-fiftieth of a current flowing through the at least one semiconductor light emitting element;
  wherein the resistor comprises a thick film resistor disposed on the substrate; and
 a plurality of wiring electrodes to which the at least one semiconductor light emitting element and the thick film resistor are coupled,
  wherein the plurality of wiring electrodes are disposed in parallel to the at least one semiconductor light emitting element such that the at least one semiconductor light emitting element is disposed between the plurality of wiring electrodes, and
  wherein the thick film electrode crosses the plurality of wiring electrodes, so as to be coupled to the plurality of wiring electrodes.

2. The light emitting device according to claim 1,
 wherein the at least one semiconductor light emitting element comprises a gallium nitride semiconductor light emitting element, and
 wherein the resistance of the resistor is equal to or more than 15 KΩ and equal to or less than 10 MΩ.

3. The light emitting device according to claim 2, wherein the resistance of the resistor is equal to or more than 1501KΩ and equal to or less than 1 MΩ.

4. The light emitting device according to claim 1, wherein the substrate comprises a recognition pattern serving as a marker in a fabrication process, and wherein the recognition pattern comprises a same material as a material of the plurality of wiring electrodes or the thick film resistor.

5. The light emitting device according to claim 1, wherein the at least one semiconductor light emitting element of each of the plurality of light emitting device units comprises a plurality of semiconductor light emitting elements coupled in parallel to each other.

6. The light emitting device according to claim 1, wherein each of the plurality of light emitting device units is sealed in a single package.

7. The light emitting device according to claim 6, wherein the plurality of light emitting device units comprise three or more light emitting device units coupled to each other in series, the three or more light emitting device units constituting a first composite light emitting device unit.

8. The light emitting device according to claim 1, wherein the at least one semiconductor light emitting element of each of the plurality of light emitting device units comprises three or more semiconductor light emitting elements coupled to each other in series on the substrate, the three or more semiconductor light emitting elements constituting a second composite light emitting device unit.

9. The light emitting device according to claim 8, wherein the second composite light emitting device unit is sealed in a single package.

10. The light emitting device according to claim 1, further comprising a power source configured to supply a direct current to the plurality of light emitting device units.

11. A light emitting device unit comprising:
 a substrate;
 at least one semiconductor light emitting element disposed on the substrate; and
 a resistor coupled to the at least one semiconductor light emitting element,
  wherein the resistor is coupled in parallel to the at least one semiconductor light emitting element,
  wherein the resistor has a resistance set at such a value that when a light emitting operation voltage for causing light emission of the at least one semiconductor light emitting element is applied to the at least one semiconductor light emitting element, a current flowing through the resistor is equal to or less than one-fiftieth of a current flowing through the at least one semiconductor light emitting element;
  wherein the resistor comprises a thick film resistor disposed on the substrate; and
 plurality of wiring electrodes to which the at least one semiconductor light emitting element and the thick film resistor are coupled,
  wherein the plurality of wiring electrodes are disposed in parallel to the at least one semiconductor light emitting element such that the at least one semiconductor light emitting element is disposed between the plurality of wiring electrodes, and
  wherein the thick film electrode crosses the plurality of wiring electrodes, so as to be coupled to the plurality of wiring electrodes.

\* \* \* \* \*